United States Patent [19]

Miller

[11] Patent Number: 5,023,556

[45] Date of Patent: Jun. 11, 1991

[54] SENSOR CIRCUIT RESPONSE TO DIFFERENT FLUID CONDUCTIVITIES AND HAVING TIME DELAY FEATURE

[75] Inventor: Francis M. Miller, Clearwater, Fla.

[73] Assignee: Conax Florida Corporation, St. Petersburg, Fla.

[21] Appl. No.: 473,883

[22] Filed: Feb. 2, 1990

[51] Int. Cl.[5] ............... G01R 27/02; F42C 11/06
[52] U.S. Cl. .................... 324/439; 324/444; 340/620; 361/251; 102/220
[58] Field of Search ........... 324/439, 444; 361/251; 340/620; 244/151 B; 102/206, 218, 220

[56] References Cited

U.S. PATENT DOCUMENTS

| | | | |
|---|---|---|---|
| 4,382,231 | 5/1983 | Miller | 324/439 |
| 4,513,248 | 4/1985 | Miller | 324/439 |
| 4,827,844 | 5/1989 | Miller | 361/251 X |

Primary Examiner—Reinhard J. Eisenzopf
Assistant Examiner—Jack B. Harvey
Attorney, Agent, or Firm—Edwin T. Bean, Jr.; Martin G. Linihan; John C. Thompson

[57] ABSTRACT

A circuit for operating a load in response to predetermined external conductivity conditions comprising a pair of sensing electrodes, a source of electrical energy connected to one of the electrodes, a load connected to the other of the electrodes, a controlled switch connected to the load, a first energy storage branch having a timing chracteristic and connected between the source and the other electrode, a second energy storage branch having a timing characteristic and connected across the combination of the load and a controlled switch, and a control operatively connected to the first and second branches and connected in controlling relation to the controlled switch so that when the electrodes are exposed to a first medium having a predetermined electrical conductivity energy builds up on first and second branches and the controlled switch is open and then a predetermined time after the electrodes are exposed to a second medium having a different electrical conductivity the controlled switch is closed and the load is operated by energy stored in the second branch. The first and second energy storage branches have different timing characteristics, and the predetermined time is a function of that difference. The control and its connection in the circuit are determined so as to be responsive to the first medium being of higher electrical conductivity than the second medium, for example, water being the first medium and air the second. The load can be an electro-explosive device of an automatic release mechanism for an aviator helmet.

21 Claims, 2 Drawing Sheets

SENSOR CIRCUIT RESPONSE TO DIFFERENT FLUID CONDUCTIVITIES AND HAVING TIME DELAY FEATURE

BACKGROUND OF THE INVENTION

This invention relates to circuits for controlled charging and discharging of energy storage devices such as capacitors associated with a load, and more particularly to a new and improved circuit for controlled charging and discharging of an energy storage device in response to predetermined fluid conductivity conditions.

One area of use of the present invention is in controlled firing of electro-explosive devices, although the principles of the invention can be variously applied. Electro-explosive devices can find use in a variety of applications, for example parachute canopy release mechanisms, pressurized gas release devices for inflating floatation equipment such as life vests or life rafts, and many other applications. A typical circuit for activating an electro-explosive device includes a capacitor which is charged from a supply and then discharged in a controlled manner through the device. The circuit also includes sensing electrodes and a conductivity sensing portion whereby the controlled charging and discharging of the capacitor typically has been performed only when the sensing electrodes are exposed to liquid having a predetermined electrical conductivity, i.e. a body of water.

U.S. Pat. No. 4,763,077 issued Aug. 9, 1988 and assigned to the assignee of the present invention discloses a circuit wherein the controlled charging and discharging of an energy storage device or capacitor is in response to sensing electrodes being exposed sequentially to mediums of different conductivity. In particular, the capacitor could be charged when the electrodes are exposed to a body of water and substantially discharged when the electrodes leave the water and are exposed to air. One example of use of that circuit is firing an electro-explosive device in a pressurized gas release device for inflating floatation equipment in the form of life vests. When a helicopter enters water it usually inverts, and to prevent drowning the life vest worn by the pilot should not be automatically inflated until he is able to leave the submerged helicopter and rise to the surface of the water. When ship personnel wearing life vests work below deck and a large volume of water suddenly enters the area, it is desired not to have the vests inflated so that they can more easily climb ladders or stairs in leaving the area. Another example is firing an electro-explosive device in an aviator helmet breathing mask release mechanism. It is desired not to release the masks while the pilot is under water after ejection and descent by parachute thereby utilizing the small residual air supply in the breathing mask and tube. However, once the pilot's head emerges above the water surface, it is desired to remove the mask especially since the pilot may be unconscious and drown if the mask is not removed.

An important consideration in the design of such a circuit is avoiding premature operation in response to rapid excursions in the apparent conductivity at the sensing electrodes caused by turbulence in the water. Another important design consideration is avoiding undesired operation in response to an apparent conductivity change when the electrodes are first exposed to salt fog spray and then become dry. Accordingly, it would be highly desirable to provide such a circuit wherein operation is in response to the sensing electrodes being exposed to separate or distinct mediums of different electrical conductivity, not merely apparent conductivity changes due to turbulence in one medium or to the effect of salt fog exposure.

SUMMARY OF THE INVENTION

It is, therefore, a primary object of this invention to provide a new and improved circuit for controlled charging and discharging of energy storage devices associated with a load in response to sequential exposure to mediums or fluids of different electrical conductivity.

It is a more particular object of this invention to provide such a circuit which operates when exposed sequentially to separate or distinct mediums of different electrical conductivity, not to merely apparent conductivity charged due to turbulence in one medium or salt fog spray.

It is a further object of this invention to provide such a circuit wherein charging of the energy storage devices is in response to exposure to water and discharging is in response to exposure to air.

It is a further object of this invention to provide such a circuit for firing an electro-explosive device.

It is a further object of this invention to provide such a circuit for firing an electro-explosive device of an automatic release mechanism for an aviator helmet.

The present invention provides a circuit for operating a load in response to predetermined external conductivity conditions comprising a pair of sensing electrodes, a source of electrical energy connected to one of the electrodes, a load connected to the other of the electrodes, a controlled switch connected to the load, a first energy storage branch having a timing characteristic and connected between the source and the other electrode, a second energy storage branch having a timing characteristic and connected across the combination of the load and controlled switch, and control means operatively connected to the first and second branches and connected in controlling relation to the controlled switch so that when the electrodes are exposed to a first medium having a predetermined electrical conductivity energy builds up on said first and second branches and said controlled switch is open and then a predetermined time after the electrodes are exposed to a second medium having a different electrical conductivity the controlled switch is closed and the load is operated by energy stored in the second branch. The first and second energy storage branches have different timing characteristics, and the predetermined time is a function of that difference. The first and second energy storage branches may be viewed as providing energy storage means for storing energy when the electrodes are exposed to the first medium for operating the load when the electrodes are exposed to the second medium and providing time delay means for establishing the predetermined time after which the load is operated. The control means and its connection in the circuit are determined so as to be responsive to the first medium being of higher electrical conductivity than the second medium, for example water being the first medium and air the second. The load can be an electro-explosive device of an automatic release mechanism for an aviator helmet.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENT

An example of use of the circuit of the present invention is firing an electro-explosive device in an automatic release mechanism for an aviator helmet breathing mask. One illustrative arrangement is described in the aformentioned U.S. Pat. No. 4,763,077, the disclosure of which is hereby incorporated by reference. Briefly, that arrangement includes an automatic release mechanism incorporated in the bayonet receiver for automatically and explosively separating the bayonet from the bayonet receiver in response to a predetermined event, for example immersion in water followed by emergence from the water a short time later. When actuated, an explosive charge drives a piston generally at right angles against a bayonet, driving the latter against the cover of the assembly separating the cover from the bayonet receiver and ejecting the bayonet from the receiving channel. An alternative arrangement is described in U.S. Pat. No. 4,869,245 issued Sept. 26, 1989 and assigned to the assignee of the present invention. In this alternative arrangement the automatic release mechanism operates without explosively propelling the bayonet or any component of the mechanism from the helmet shell. A cutter is explosively driven tangentially of the helmet shell to sever fasteners thereby allowing components including the mask to separate from the assembly by gravity action.

In both forms of the automatic release mechanism, the circuit of the present invention is contained in a body of insulative material located adjacent one end of the mechanism housing. The circuit includes two sensing electrodes, one carried by the body enclosing the circuit and the other electrode comprising the conductive surface of a component of the mechanism such as the actuator body or housing or the mounting plate. As a result, the two electrodes of the circuit sense the presence of a fluid medium surrounding the mechanism.

Figure 1:
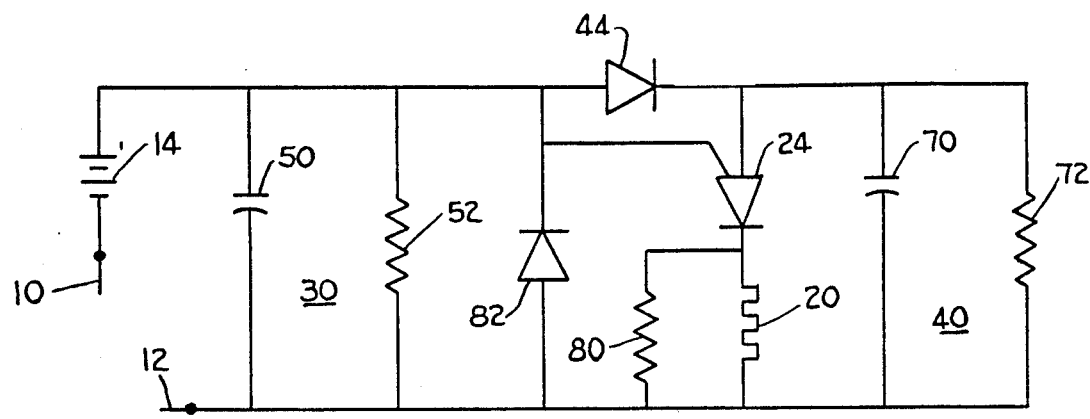
FIG. 1 is a schematic diagram of the circuit of the present invention for operating a load in response to predetermined external fluid conductivity conditions.

The circuit of the present invention is shown in FIG. 1 and includes sensing means in the form a pair of sensing electrodes 10 and 12 and a source of electrical energy in the form of battery 14. In the illustrative use of the circuit described hereinabove, one of the electrodes 10,12 is carried by the body enclosing the circuit and the other electrode is a conductive surface of a component of the mechanism. While a single battery 14 is shown in the circuit of FIG. 1, two or more batteries can be connected in series to provide the desired voltage. In the circuit shown, the one sensing electrode 10 is connected to the negative terminal of the battery 14.

The circuit further includes a load 20, which in the present example is in the form of an electro-explosive device or bridgewire, and a controlled switch 24 connected in series with load 20. The load 20 also is connected to the other sensing electrode 12.

The circuit of the present invention further comprises a first RC circuit branch generally designated 30 connected between the other terminal of the voltage source 14 and the other sensing electrode 12 and a second RC circuit branch generally designated 40 connected across the series combination of load 20 and controlled switch 24. The circuit of the present invention also includes control means including a diode 44 operatively connected to the first RC circuit branch 30 and connected in controlling relation to controlled switch 24. When the electrodes 10,12 are exposed to a first medium having a predetermined electrical conductivity, voltage builds upon the first and second RC circuit branches 30 and 40, respectively, and the controlled switch is open. Then a predetermined time after the electrodes are exposed to a second medium having a different electrical conductivity the controlled switch 24 is closed and the load 20 is operated by energy stored in the second RC circuit of branch 40. The predetermined time is established by the difference in the time constants of the RC circuit branches 30,40.

Referring to the circuit of FIG. 1 in further detail, the first energy storage branch 30 is in the form of an RC circuit comprising the parallel combination of capacitor 50 and resistor 52. One terminal of capacitor 50 is connected to the positive terminal of voltage source 14 and the other terminal of capacitor 50 is connected to sensing electrode 12. Resistor 52 is connected across capacitor 50. Controlled switch 24 is a thyristor of anode/gate configuration, the cathode of which is connected to one terminal of load 20. The other terminal of load 20 is connected to sensing electrode 12. The anode of thyristor 24 is connected to the cathode of control diode 44, and the gate of thyristor 24 is connected to the anode of diode 44. The anode of control diode 44, in turn, is connected to the junctions of RC circuit 30 and the positive terminal of voltage source 14.

The second energy storage branch 40 is in the form of an RC circuit comprising the parallel combination of capacitor 70 and resistor 72. One terminal of capacitor 70 is connected to the junction of thyristor 24 and control diode 44, and the other terminal of capacitor 70 is connected to sensing electrode 12. Resistor 72 is connected across capacitor 70.

A protective resistor 80 is connected across bridgewire 20 for a purpose which will be described. A protective diode 82 is connected across the combination of load 20, thyristor 24 and control diode 44 for static discharge protection which will be described. The anode of protective diode 82 is connected to the junction of load 20 and resistor 80, and the cathode of protective diode 82 is connected to the anode of control diode 44.

Figure 2:
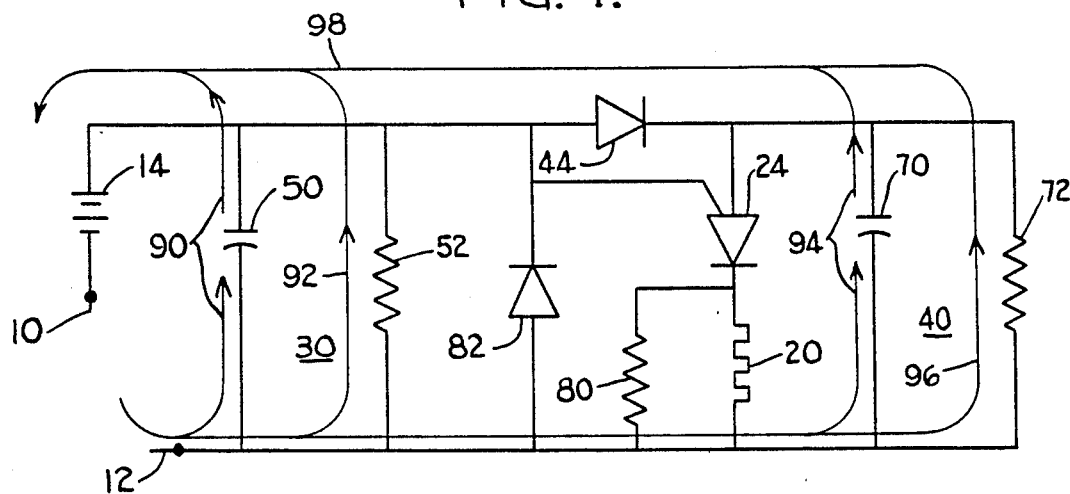
FIG. 2 is a schematic diagram illustrating one stage in the operation of the circuit of FIG. 1.

The circuit of FIG. 1 operates in the following manner. In response to sensing electrodes 10,12 being exposed to a medium or fluid of predetermined conductivity, for example water, a circuit is completed including electrodes 10 and 12, RC circuit branches 30 and 40, and diode 44. Current flows in the circuit along the paths designated 90,92,94,96 and 98 in FIG. 2 charging capacitors 50 and 70 to a voltage close to that of source 14. For example, in an illustrative circuit which will be described presently, with source 14 being a 6.6 volt battery, capacitors 50 and 70 each charge up to a voltage of nearly 6.0 volts in about 2 seconds. Since the anode of diode 44 is connected to the positive terminal of source 14, diode remains on or conducting during the charging of capacitors 50,70 to a voltage slightly less than the voltage of source 14.

When electrodes 10,12 are removed from the water medium and are in air, there is no longer a flow of current between electrodes 10,12 and source 14 is functionally removed from the circuit. Capacitors 50 and 70 begin to discharge along the paths designated 102 and 104, respectively, in FIG. 3. Initially there is flow of current also along path 106. In the illustrative circuit previously mentioned, capacitor 50 has a smaller capacitance as compared to capacitor 70 and as a result capacitor 50 discharges at a rate much faster than that of capacitor 70. After a short time delay, for example 2-3 tenths of a second, the voltage difference between capacitors 50 and 70, and likewise across diode 44 and across the anode/gate connections of controlled switch 24, is sufficient to turn thyristor 24 on. This allows capacitor 70 to discharge through load 20 along the path designated 108 in FIG. 4. The first and second energy storage branches 30 and 40, respectively, may be viewed as providing energy storage means for storing energy when the electrodes 10,12 are exposed to the first medium for operating load 20 when the electrodes are exposed to the second medium and providing time delay means for establishing the predetermined time after which load 20 is operated.

Figure 3:
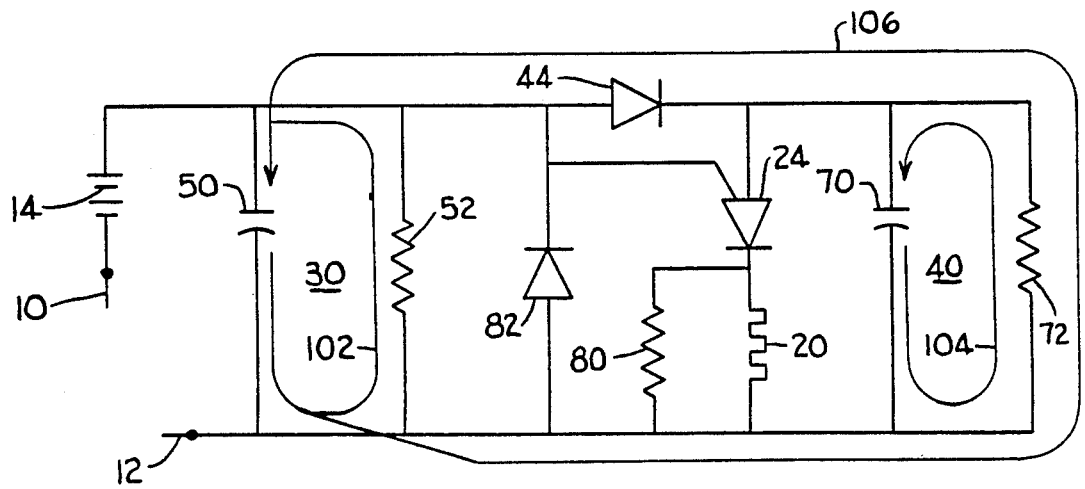
FIG. 3 is a schematic diagram illustrating a further stage in the operation of the circuit of FIG. 1.
Figure 4:
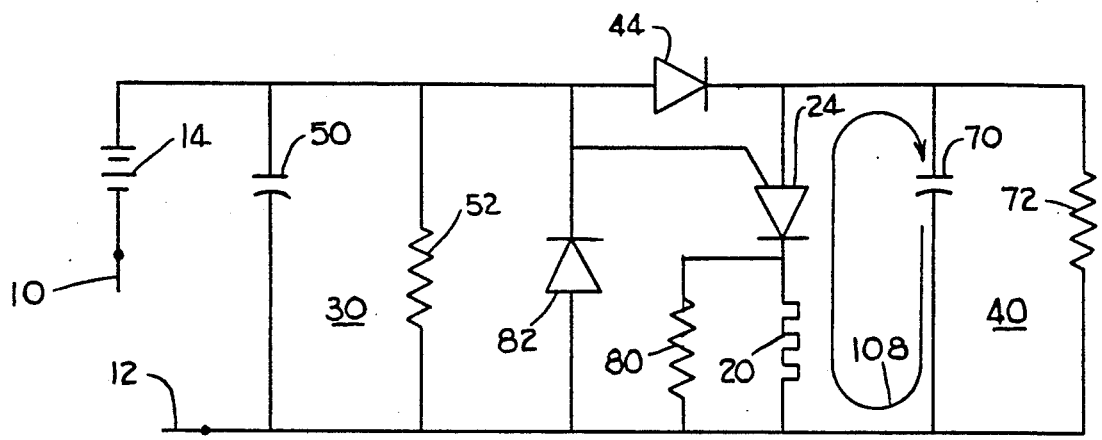
FIG. 4 is a schematic diagram illustrating a still further stage in the operation of the circuit of FIG. 1.
Figure 5A:
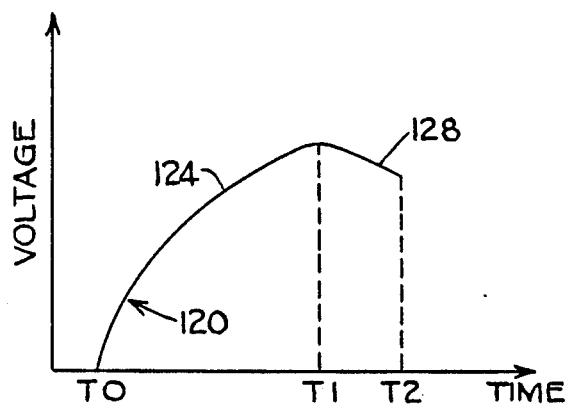
FIGS. 5A and 5B are graphs including waveforms further illustrating operation of the circuit of FIG. 1.
Figure 5B:
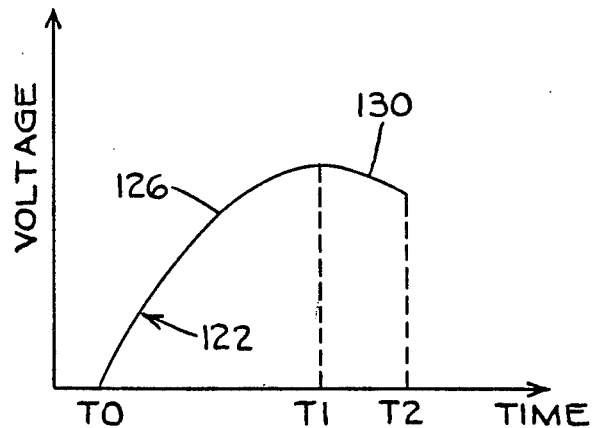

The operation of the circuit of FIG. 1 is illustrated further by the waveforms 120 and 122 in FIGS. 5A and 5B, respectively. Waveform 120 is the voltage on capacitor 50 as a function of time and waveform 122 is the voltage on capacitor 70 as a function of time. Both waveforms begin at the time TO corresponding to the instant when sensing electrodes 10,12 are immersed in the first medium, i.e. water. Portion 124 of waveform 120 corresponds to charging of capacitor 50 up to a voltage nearly equal to that of source 14 as previously described. Similarly, portion 126 of waveform 122 corresponds to charging of capacitor 70 to a voltage nearly equal to that of the source. In the illustrative circuit described hereinabove, with a 6.6 volt source capacitors 50 and 70 each charge up to a voltage of about 6.0 volts. At time T1 sensing electrodes 10,12 are removed from the first medium, i.e. water, and are in the second medium, i.e. air. Portion 128 of waveform 120 indicates the decreasing voltage on capacitor 50 as it discharges along the path 102 through resistor 52 as illustrated in FIG. 3. Portion 130 of waveform 122 indicates the decreasing voltage on capacitor 70 as it discharges along the path 104 through resistor 72 as illustrated in FIG. 3. In comparing FIGS. 5A and 5B it is seen that waveform portion 128 decreases more rapidly than waveform portion 130 due to the lower magnitude of capacitor 50 in comparison to the magnitude of capacitor 70 as previously described. Thus, during this mode of operation of the circuit of FIG. 1 there is a difference which develops between the voltages on capacitors 50 and 70 which voltage difference increases gradually with time. As previously described, this voltage difference appears across diode 44 and simultaneously across the anode/gate connections of controlled switch 24. At time T2 this voltage difference reaches the anode/gate turn on voltage thyristor 24 causing it to turn on and complete a circuit path enabling capacitor 70 to discharge through lead 20 as previously described. In the illustrative circuit described hereinabove, the interval T2-T1, i.e. the aforementioned time delay, is about 0.3 seconds and the turn on voltage of thyristor 24 is about 0.6 volts.

Thus, when the sensing electrodes are exposed to a change in conductivity, i.e. from water to air, load 20 is not operated until after a predetermined time delay. The duration of time delay, i.e. the 0.3 second illustrative delay mentioned above, is selected to be greater than the duration of rapid excursions in the apparent conductivity at the sensing electrodes. Such excursions can result from turbulence in the medium, such as in water. For example, when a person enters water wearing a parachute some turbulence results causing cavitation which can result in rapid excursion in the apparent conductivity sensed by electrodes 10,12. This, in turn, could cause early, premature operation of the load thereby undesirably releasing the mask from the person's helmet while still under water.

The circuit of the present invention also avoids unwanted operation of load 20 in response to an apparent change in conductivity when the electrodes 10,12 are first exposed to salt fog spray and then become dry. This can happen, for example, when the circuit is part of a helmet release mechanism is located in aircraft on the deck of a carrier. As the electrodes 10,12 are exposed to the somewhat conductive salt fog spray, the stored energy can build up to the point where the circuit arms itself. When the salt fog disappears and the electrodes 10,12 dry, this apparent change in conductivity can cause undesired firing of the explosive charge 20 resulting in personal injury and equipment damage. The magnitudes of capacitor 50 and resistor 52 are selected so that capacitor 50 discharges faster than the electrodes 10,12 can dry. Therefore, when the electrodes 10,12 dry and source 14 is functionally removed from the circuit the voltage on capacitor 70 will be insufficient to operate load 20.

Resistor 80 prevents a voltage build-up across the circuit connections to electro-explosive device 20 when the device is removed during replacement or repair. Otherwise, if such build-up were allowed to occur, re-connection of device 20 could operate thyristor 24 causing inadvertent firing of device 20.

Diode 82 provides static discharge protection for thysistor 24 in the situation where the top portion of the circuit as viewed in FIG. 1 becomes negative relative to the bottom of the circuit. Diode 82 is selected to withstand 25 kilovolts static discharge. Thyristor 24 is of anode gate configuration to provide enhanced gate sensitivity.

By way of example, in an illustrative circuit, battery 14 comprises the series combination of two 3.3 volt batteries to provide a total output of 6.6 volts, load 20 is an electro-explosive device commercially available from Conax Florida Corporation Model CC-114 rated 2-5 ohms, thrsistor 24 is a Motorola MMBP6027 programmable unijunction transistor, capacitor 50 has a magnitude of 3.3 micro farads, capacitor 70 has a magnitude of 47 microfarads, each of resistors 52 and 72 has a magnitude of 1 megohm and resistor 80 has a magnitude of 1 kilohm.

It is therefore apparent that the present invention accomplishes its intended object. While an embodiment of the present invention has been described in detail, that is for the purpose of illustration, not limitation.

I claim:

1. A circuit for operating a load in response to predetermined external conductivity conditions comprising:
   (a) a pair of sensing electrodes;
   (b) a source of electrical energy having a pair of terminals, one of which is connected to one of said electrodes;
   (c) a load having a pair of terminals, one of which is connected to the other of said sensing electrodes;
   (d) a controlled switch connected to the other terminal of said load so as to be in series therewith;
   (e) energy storage means operatively connected to said source and to said other electrode;
   (f) control means operatively connected to said energy storage means and connected in controlling relation to said controlled switch; and
   (g) time delay means operatively connected to said control means;
   (h) so that when said electrodes are exposed to a first medium having a predetermined electrical conductivity energy builds up on said storage means and said controlled switch is open and then a predetermined time after said electrodes are exposed to a second medium having a different electrical conductivity said controlled switch is closed and said load is operated by energy stored in said energy storage means, said predetermined time being established by said time delay means.

2. A circuit according to claim 1, wherein the nature of said control means and its connection in said circuit are determined so as to be responsive to said first medium being of higher electrical conducitivity than said second medium.

3. A circuit according to claim 1, wherein the nature of said control means and its connection in said circuit are determined to be responsive to said first medium being water and said second medium being air.

4. A circuit according to claim 1, wherein said load is an electro-explosive device.

5. A circuit according to claim 1, wherein said load is an electro-explosive device for use in an automatic release mechanism for an aviator helmet breathing mask.

6. A circuit for operating a load in response to predetermined external conductivity conditions comprising:
   (a) a pair of sensing electrodes;
   (b) a source of electrical energy having a pair of terminals, one of which is connected to one of said electrodes;
   (c) a load having a pair of terminals, one of which is connected to the other of said sensing electrodes;
   (d) a controlled switch connected to the other terminal of said load so as to be in series therewith;
   (e) a first energy storage branch having a timing characteristic connected between the other terminal of said source and the other of said sensing electrodes;
   (f) a second energy storage branch having a timing characteristic and connected across the series combination of said load and said controlled switch; and
   (g) control means operatively connected to said first and second energy storage branches and connected in controlling relation to said controlled switch so that when said electrodes are exposed to a first medium having a predetermined electrical conductivity energy builds up on said first and second energy storage branches and said controlled switch is open and then a predetermined time after said electrodes are exposed to a second medium having a different electrical conductivity said controlled switch is closed and said load is operated by energy stored in said second branch.

7. A circuit according to claim 6, wherein said first and second energy storage branches have different time characteristics, said predetermined time being a function of the difference between said different time characteristics.

8. A circuit according to claim 6, wherein said first and second energy storage branches comprise first and second RC circuits respectively, each having a time constant.

9. A circuit according to claim 8, wherein the time constant of said second RC circuit is greater than the time constant of said first RC circuit.

10. A circuit according to claim 6, wherein the nature of said control means and its connection in said circuit are determined so as to be responsive to said first medium being of higher electrical conductivity than said second medium.

11. A circuit according to claim 6, wherein the nature of said control means and its connection in said circuit are determined to be responsive to said first medium being water and said second medium being air.

12. A circuit according to claim 6, wherein said control means includes a diode connected so that said controlled switch is open when said electrodes are exposed to said first medium and so that said controlled switch is closed said predetermined time after said electrodes are exposed to said second medium.

13. A circuit according to claim 6, wherein said load is an electro-explosive device.

14. A circuit according to claim 6, wherein said load is an electro-explosive device for use in an automatic release mechanism for an aviator helmet breathing mask.

15. A circuit for operating a load in response to predetermined external conductivity conditions comprising:
   (a) a pair of sensing electrodes;
   (b) a source of voltage having a pair of terminals, one of which is connected to one of said electrodes;
   (c) a load having a pair of terminals, one of which is connected to the other of said sensing electrodes;
   (d) a controlled switch connected to the other terminal of said load so as to be in series therewith, said controlled switch having a control terminal;
   (e) a first RC circuit branch having a time constant and being connected between the other terminal of said voltage source and the other of said sensing electrodes;
   (f) a second RC circuit branch having a time constant and being connected across the series combination of said load and said controlled switch, said time constant of said second RC branch being different from said time constant of said first RC branch;
   (g) control means including a diode operatively connected to said first and second RC branches and connected in controlling relation to said control terminal of said controlled switch so that when said electrodes are exposed to a first medium having a predetermined electrical conductivity voltage builds up on said first and second RC circuit branches and said controlled switch is open and when said electrodes are subsequently exposed to a second medium having a different electrical conductivity said controlled switch is closed after a predetermined time delay and said load is operated by energy stored in said second RC circuit, said time delay being a function of the difference in said time constants.

16. A circuit according to claim 15, wherein each of said first and second RC circuit branches comprises a parallel RC combination.

17. A circuit according to claim 15, wherein the time constant of said second RC branch is greater than the time constant of said first RC circuit branch.

18. A circuit according to claim 15, wherein said control means is connected in said circuit so as to be responsive to said first medium being of higher electrical conductivity than said second medium.

19. A circuit according to claim 15, wherein said control means is connected in said circuit so as to be responsive to said first medium being water and said second medium being air.

20. A circuit according to claim 15, wherein said load is an electro-explosive device.

21. A circuit according to claim 15, wherein said load is an electro-explosive device for use in an automatic release mechanism for an aviator helmet breathing mask.

* * * * *